United States Patent
Ishii et al.

(10) Patent No.: US 11,750,216 B2
(45) Date of Patent: Sep. 5, 2023

(54) DECODING APPARATUS, CONTROL CIRCUIT, AND STORAGE MEDIUM

(71) Applicant: MITSUBISHI ELECTRIC CORPORATION, Tokyo (JP)

(72) Inventors: Kenji Ishii, Tokyo (JP); Hideo Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/544,090

(22) Filed: Dec. 7, 2021

(65) Prior Publication Data

US 2022/0094371 A1 Mar. 24, 2022

Related U.S. Application Data

(63) Continuation of application No. PCT/JP2019/023537, filed on Jun. 13, 2019.

(51) Int. Cl.
*H03M 13/00* (2006.01)
*H03M 13/11* (2006.01)
*H03M 13/37* (2006.01)

(52) U.S. Cl.
CPC .... *H03M 13/1105* (2013.01); *H03M 13/1148* (2013.01); *H03M 13/3746* (2013.01)

(58) Field of Classification Search
CPC ......... H03M 13/1105; H03M 13/1148; H03M 13/3746
See application file for complete search history.

(56) References Cited

U.S. PATENT DOCUMENTS

| 7,467,347 B2* | 12/2008 | Orio | H04L 1/005 |
| | | | 714/795 |
| 7,793,201 B1 | 9/2010 | Ulriksson | |
| 8,495,479 B1* | 7/2013 | Varnica | H03M 13/1111 |
| | | | 714/780 |

(Continued)

FOREIGN PATENT DOCUMENTS

| EP | 3 700 094 A1 | 8/2020 |
| JP | 2010-268114 A | 11/2010 |

(Continued)

OTHER PUBLICATIONS

Kudekar et al., "Threshold Saturation via Spatial Coupling: Why Convolutional LDPC Ensembles Perform So Well over the BEC", IEEE Transactions on Information Theory, Feb. 2011, vol. 57, No. 2, p. 803-834.

(Continued)

*Primary Examiner* — Esaw T Abraham
(74) *Attorney, Agent, or Firm* — BIRCH, STEWART, KOLASCH & BIRCH, LLP

(57) ABSTRACT

A decoder that is a decoding apparatus includes an error-correction decoder that executes error correction decoding processing of iteratively performing decoding processing with a window size and the number of decoding iterations indicated by decoding parameters, on received data converted into a spatially coupled low-density parity-check code, and a decoding parameter control unit that updates the decoding parameters on the basis of a decoding result obtained by the iteratively executed decoding processing.

8 Claims, 9 Drawing Sheets

(56) References Cited

U.S. PATENT DOCUMENTS

| | | | |
|---|---|---|---|
| 8,856,626 B2* | 10/2014 | Obata | H03M 13/1111 |
| | | | 714/779 |
| 10,367,528 B2* | 7/2019 | Goldenberg | H03M 13/1154 |
| 10,382,067 B2* | 8/2019 | Sharon | G06F 11/1012 |
| 10,868,566 B2* | 12/2020 | Yang | H03M 13/3746 |
| 2006/0023816 A1* | 2/2006 | Hekstra | H03M 13/41 |
| | | | 375/340 |
| 2013/0254633 A1 | 9/2013 | Obata et al. | |
| 2017/0093428 A1* | 3/2017 | Yen | H03M 13/35 |
| 2018/0013451 A1* | 1/2018 | Kaynak | G11C 29/52 |
| 2020/0244286 A1 | 7/2020 | Kubo | |
| 2020/0382134 A1 | 12/2020 | Ishii et al. | |

FOREIGN PATENT DOCUMENTS

| | | |
|---|---|---|
| JP | 2012-151801 A | 8/2012 |
| JP | 2013-198017 A | 9/2013 |
| WO | WO 2018/042699 A1 | 3/2018 |
| WO | WO 2019/102621 A1 | 5/2019 |

OTHER PUBLICATIONS

Extended European Search Report dated Apr. 7, 2022 issued in corresponding European Patent Application No. 19932351.0.

* cited by examiner

DECODING APPARATUS, CONTROL CIRCUIT, AND STORAGE MEDIUM

CROSS-REFERENCE TO RELATED APPLICATION

This application is a continuation application of International Application PCT/JP2019/023537, filed on Jun. 13, 2019, and designating the U.S., the entire contents of which are incorporated herein by reference.

BACKGROUND OF THE INVENTION

1. Field of the Invention

The disclosure relates to a decoding apparatus that performs error correction decoding, to a control circuit, and to a storage medium.

2. Description of the Related Art

Error-correcting codes are techniques used in wired communication systems, wireless communication systems, storage devices, etc. Specifically, error-correcting codes are techniques to add redundant bits to digital data to be sent out at the transmission end so that if an error (bit error) occurs in the data received, the error can be detected and corrected. Various error-correcting codes such as Hamming codes, Bose-Chaudhuri-Hocquenghem (BCH) codes, and Reed-Solomon (RS) codes and their decoding schemes have been proposed. By the application of error-correcting codes, the reliability of communication systems can be improved. On the other hand, the number of correctable bits is limited, and error correction performance, that is, the number of correctable bits varies depending on error-correcting codes and decoding schemes.

Here, a spatially coupled low-density parity-check (LDPC) code has been proposed as one of the codes having strong error correction performance (e.g., Non Patent Literature 1, "S. Kudekar, T. J. Richardson, and R. L. Urbanke, "Threshold Saturation via Spatial Coupling: Why Convolutional LDPC Ensembles Perform So Well over the BEC", IEEE Trans. Theory, vol. 57, No. 2, pp. 803-834, February 2011.''). This code is a type of convolutional code using LDPC codes, which are also called low-density parity-check codes, and has attracted a lot of attention in recent years as a code that can achieve error correction performance close to the Shannon limit. As one of its efficient decoding methods, window decoding is known (e.g., Japanese Patent Application Laid-open No. 2013-198017).

In window decoding performed by a decoding apparatus described in Japanese Patent Application Laid-open No. 2013-198017, decoding processing is started with a window size based on the results of estimation of channel conditions (channel information), and it is determined whether there is a residual error by a parity check of the decoding result. When the result of the determination shows that an error remains, control is performed to increase the window size. This avoids decoding processing under excessive conditions of error correction performance, reducing power consumption.

When increasing the window size, following error occurrence in the decoding processing, the decoding apparatus described in Japanese Patent Application Laid-open No. 2013-198017 increases the window size by a predetermined increase without considering error occurrence conditions etc. Consequently, the iteration of processing can occur in which the window size is increased and decoding is performed again until errors disappear, increasing processing delay and power consumption.

The disclosure has been made in view of the above, and an object thereof is to provide a decoding apparatus capable of reducing processing delay and power consumption when decoding a spatially coupled low-density parity-check code.

SUMMARY OF THE INVENTION

In order to solve the above problem and achieve the object, a decoding apparatus according to the disclosure includes: an error-correction decoder to execute error correction decoding processing of iteratively performing decoding processing with a window size and the number of decoding iterations indicated by decoding parameters, on received data converted into a spatially coupled low-density parity-check code; and a decoding parameter control unit to update the decoding parameters on a basis of a decoding result obtained by the iteratively executed decoding processing.

DETAILED DESCRIPTION OF THE PREFERRED EMBODIMENTS

Hereinafter, a decoding apparatus, a control circuit, and a storage medium according to embodiments of the disclosure will be described in detail with reference to the drawings.

First Embodiment

Figure 1:
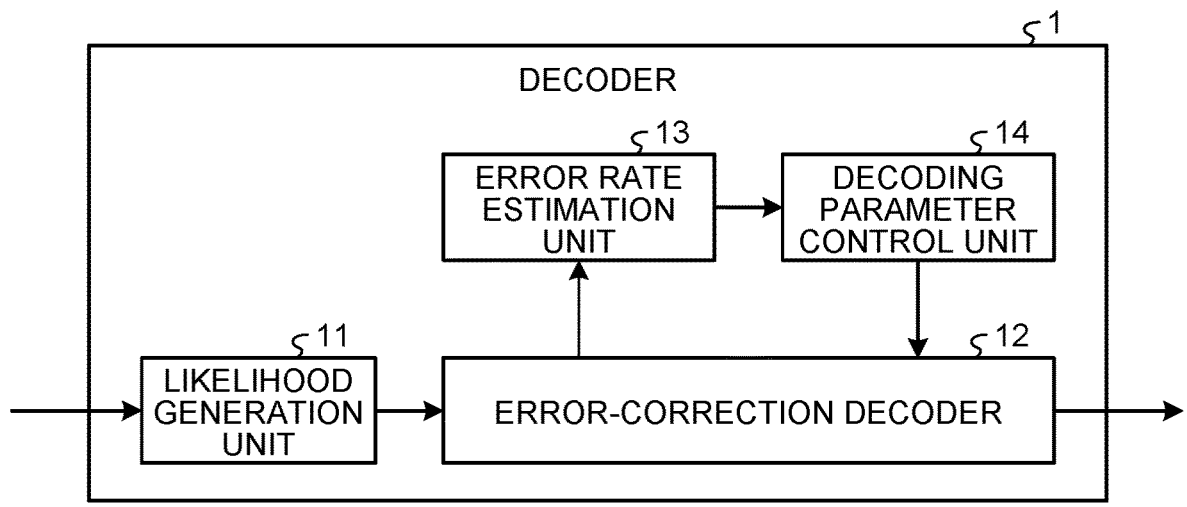
FIG. 1 is a diagram illustrating an example configuration of a decoding apparatus according to a first embodiment.

FIG. 1 is a diagram illustrating an example configuration of a decoding apparatus according to a first embodiment. A decoder 1, which is the decoding apparatus according to the first embodiment, includes a likelihood generation unit 11, an error-correction decoder 12, an error rate estimation unit 13, and a decoding parameter control unit 14. The decoder 1 constitutes, for example, a receiving apparatus included in a communication apparatus. The decoder 1 performs error correction decoding on received data converted into a spatially coupled low-density parity-check code, by the components illustrated in FIG. 1 performing processing to be described later. Received data is input to the likelihood generation unit 11. In the following description, a spatially coupled low-density parity-check code is referred to as a spatially coupled LDPC code.

The likelihood generation unit 11 calculates a likelihood from the input received data for soft-decision error correction decoding processing. The decoder 1 according to the present embodiment performs soft-decision error correction decoding. In soft decision, when data is expressed by, for example, binary data of "0" or "1", received data is not identified as "0" or "1" but is decided by a likelihood of "0" or "1" with a plurality of thresholds. As an index representing a likelihood, a log-likelihood ratio (LLR) is typically used for the error correction decoding processing in a subsequent stage. Alternatively, a likelihood ratio or a probability can be used without problems. In the above description and the following description, data handled by the decoder 1 is described as binary data. If symbol data consisting of a plurality of pieces of binary data is handled, processing is similar.

Figure 2:
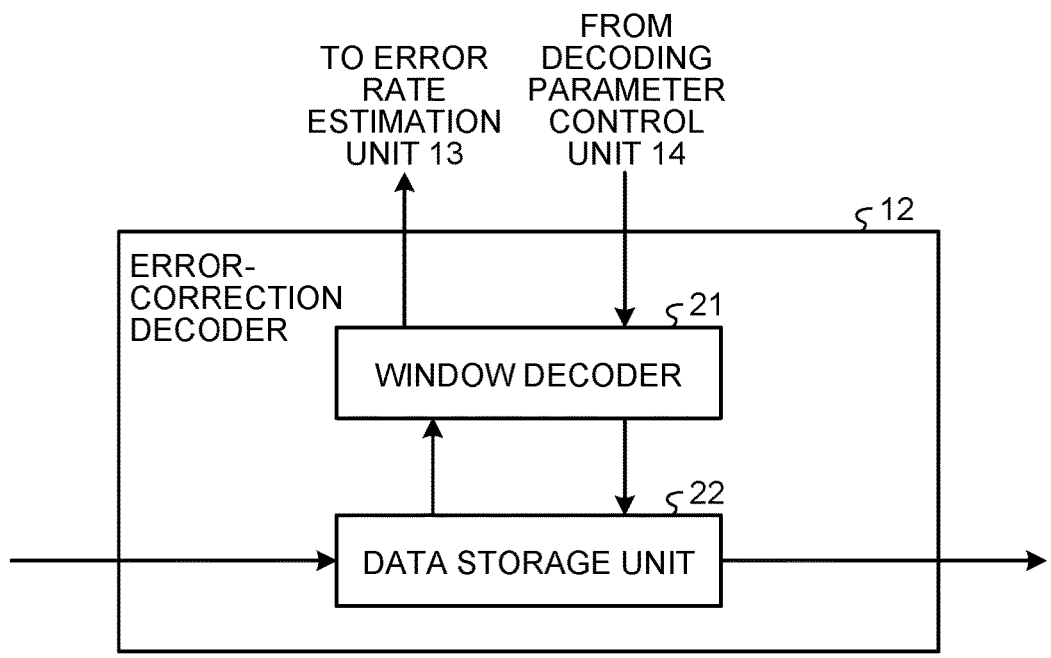
FIG. 2 is a diagram illustrating an example configuration of an error-correction decoder according to the first embodiment.

The error-correction decoder 12 performs error correction decoding processing using an LLR input. FIG. 2 is a diagram illustrating an example configuration of the error-correction decoder 12 according to the first embodiment. As illustrated in FIG. 2, the error-correction decoder 12 includes a window decoder 21 and a data storage unit 22. In the error-correction decoder 12, the data storage unit 22 holds input data. The window decoder 21 performs a decoding operation on data held in the data storage unit 22. A method of dispersing errors by inserting interleaving and deinterleaving or the like in a preceding stage of the error correction decoding processing is often used. Although not illustrated in the figure because it is not an essential part of the disclosure, the data transmission end may interleave data that has undergone error correction coding, and the decoder 1 may deinterleave an LLR output from the likelihood generation unit 11 and input it to the error-correction decoder 12.

The error rate estimation unit 13 estimates the bit error rate of a received signal (hereinafter, simply referred to as the "error rate of a received signal") on the basis of the result of decoding processing by the error-correction decoder 12. The decoding parameter control unit 14 controls decoding parameters to be applied to the error correction decoding processing in the error-correction decoder 12, on the basis of the error rate of a signal estimated by the error rate estimation unit 13.

Next, the operation of the decoder 1 to decode received data will be described. A signal received by the receiving apparatus including the decoder 1 is input to the decoder 1 after having undergone reception processing such as compensation processing and demodulation processing suitable for the transmission line.

When the signal is input to the decoder 1, first, the likelihood generation unit 11 converts the input signal into an LLR and outputs the LLR. The LLR output from the likelihood generation unit 11 is input to the error-correction decoder 12. In the error-correction decoder 12, the data storage unit 22 receives and holds the LLR. The window decoder 21 repeats a series of processing steps of reading the LLR from the data storage unit 22, performing decoding processing using decoding parameters determined by the decoding parameter control unit 14, and storing a decoding result obtained in the data storage unit 22. In addition, the window decoder 21 outputs a decoding result to the error rate estimation unit 13 in accordance with the timing when the decoding parameter control unit 14 determines decoding parameters. Alternatively, the window decoder 21 may output every decoding result obtained to the error rate estimation unit 13.

Figure 3:
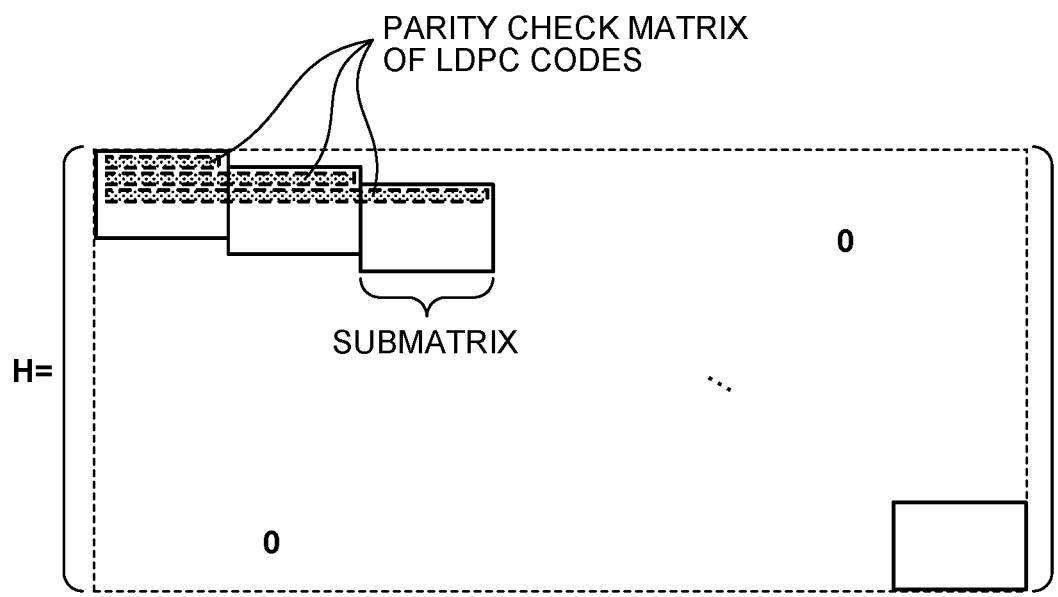
FIG. 3 is a diagram illustrating an example configuration of a parity check matrix used in error correction decoding processing by a window decoder according to the first embodiment.

The window decoder 21 decodes the received data to which the spatially coupled LDPC code is applied, using a parity check matrix H as illustrated in FIG. 3. FIG. 3 is a diagram illustrating an example configuration of the parity check matrix used in the error correction decoding processing by the window decoder 21 according to the first embodiment. The parity check matrix H illustrated in FIG. 3 includes a band matrix with smaller parity check submatrices (described as "submatrices" in FIG. 3) connected diagonally. In the following description, a "parity check submatrix" is referred to as a "submatrix". Components of the submatrices are combined with components of other adjacent submatrices so that a parity check matrix of a plurality of relatively short LDPC codes can be constructed. That is, combining a plurality of adjacent submatrices results in a structure in which a plurality of LDPC codes are convolved and connected in one long code. For the submatrices, for example, the quasi-cyclic (QC) structure of a cyclic permutation matrix may be used to use a convolutional code of QC-LDPC codes. The application of the QC structure facilitates the configuration of a check matrix and circuit implementation.

Figure 4:
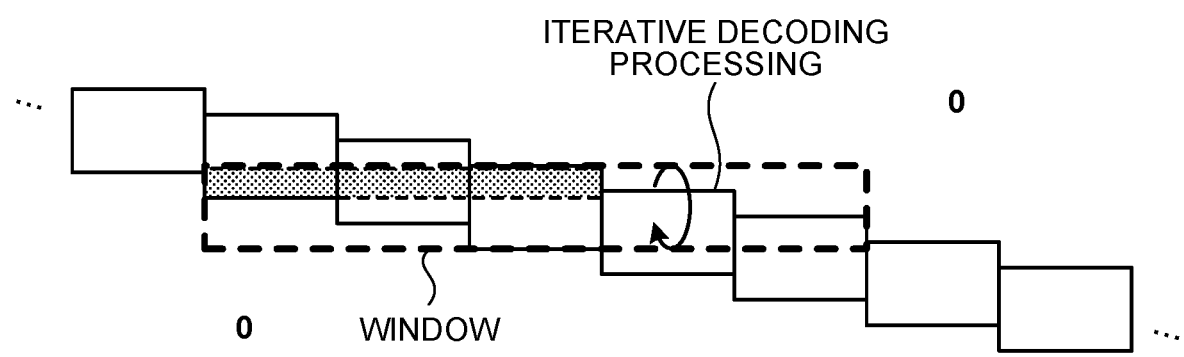
FIG. 4 is a diagram illustrating a part of the parity check matrix illustrated in FIG. 3.
Figure 5:
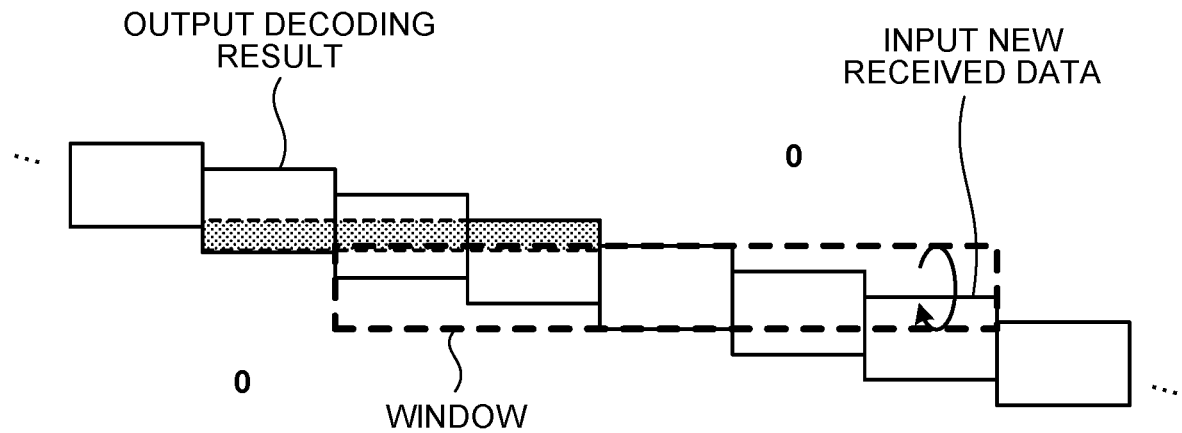
FIG. 5 is a diagram for explaining the processing by the window decoder according to the first embodiment.

In the error correction decoding processing performed by the window decoder 21, the decoding processing is performed by window size extending across a plurality of submatrices. This decoding processing is called window decoding. FIG. 4 illustrates an example of window decoding. In FIG. 4, a part of the parity check matrix H illustrated in FIG. 3 is extracted and shown. In FIG. 4, solid rectangles indicate submatrices, and a broken rectangle indicates a window. FIG. 4 illustrates an example of a case where decoding is performed with a window size extending across five submatrices. In window decoding, iterative decoding processing is typically performed in which decoding is performed from the top of a window in each column direction, the processing proceeds sequentially toward a lower row, and when the processing reaches the bottom of the window, the processing is performed from the top of the window again. To the decoding processing, a technique commonly known as an LDPC code decoding algorithm such as a sum-product decoding method or a min-sum decoding method can be applied. In the disclosure, a decoding algorithm to be used is not specified. When the decoding processing on a certain window has been completed, as illustrated in FIG. 5, the window decoder 21 outputs the result of decoding of the input signal for which the processing on the head of the window has been completed. In addition, the window decoder 21 shifts the window in a lower right direction by one submatrix and inputs new received data. Here, input means reading received data from the data storage unit 22. The window decoder 21 sequentially performs decoding processing on a new window area after the shift by a similar procedure to that of the decoding processing on a window area before the shift.

Figure 6:
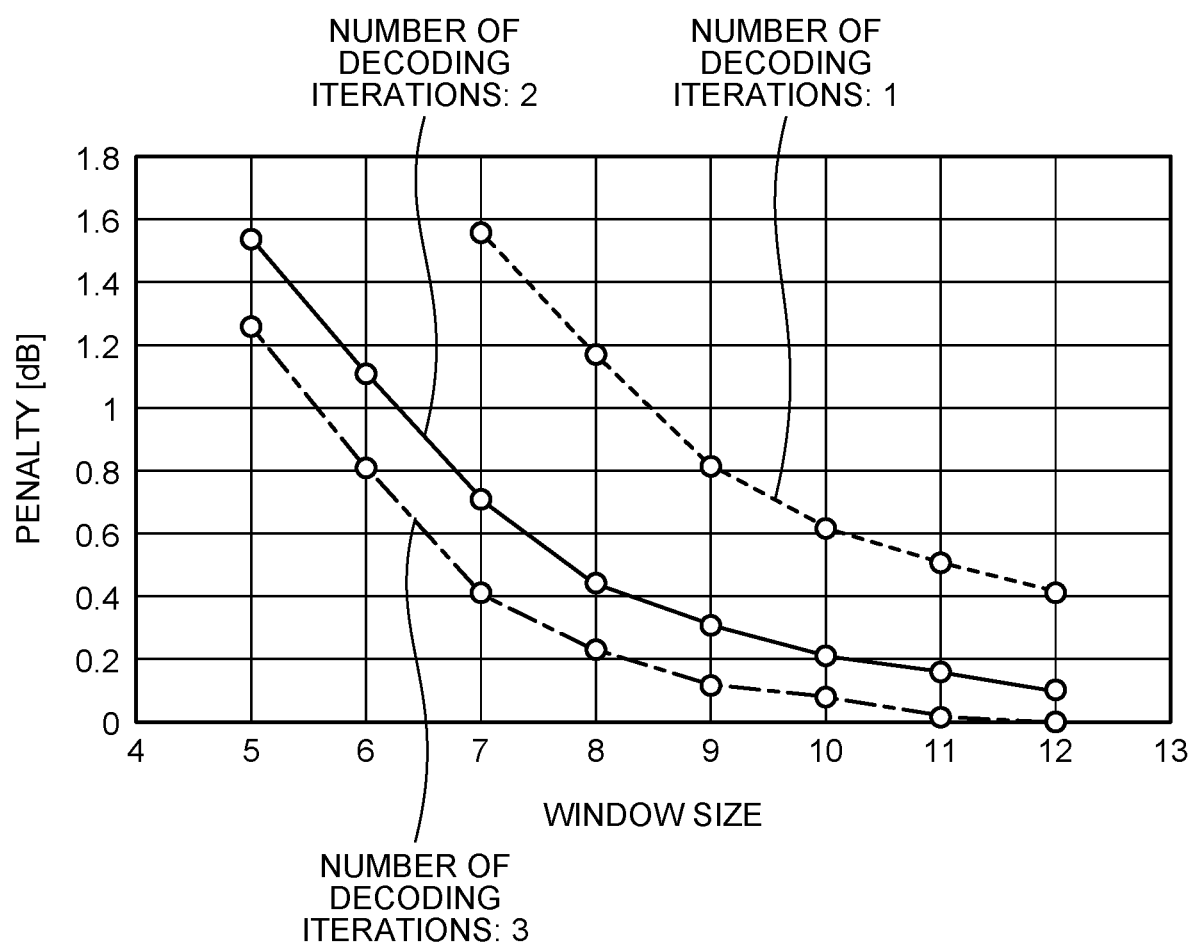
FIG. 6 is a diagram illustrating an example of the relationship between decoding parameters and error correction performance of window decoding.

In window decoding, it is known that its error correction performance varies according to the window size and the number of decoding iterations indicated by decoding parameters. This will be described with reference to FIG. 6. FIG. 6 is a diagram illustrating an example of the relationship between decoding parameters and error correction performance of window decoding. In FIG. 6, the horizontal axis represents window size. The vertical axis represents coding gain penalty in a case where the decoding parameters are changed with reference to coding gain when the decoding parameters are (the window size, the number of decoding iterations)=(12, 3). As illustrated in FIG. 6, even with the same window size, the larger the number of decoding iterations, the smaller the penalty, that is, the higher the error correction performance. Further, even with the same number of iterations, the larger the window size, the higher the error correction performance. However, there is a trade-off relationship between error correction performance and power consumption. To achieve high error correction performance for a desired throughput, it is necessary to increase one or both of the circuit size and the operating frequency to increase the amount of decoding processing per unit time, and it is necessary to increase the power consumption of the decoder. Paradoxically, if decoding parameters can be selected properly according to a communication channel for the decoder having sufficient error correction performance for the communication channel, lower power consumption can be achieved by a reduction in the operating frequency of the decoder and the intermittent operation or the stopping of operation of an arithmetic unit.

Thus, the decoder 1 according to the present embodiment selects proper decoding parameters on the basis of received data to prevent power consumption from increasing. The following describes operation to determine decoding parameters on the basis of received data in the decoder 1.

Figure 7:
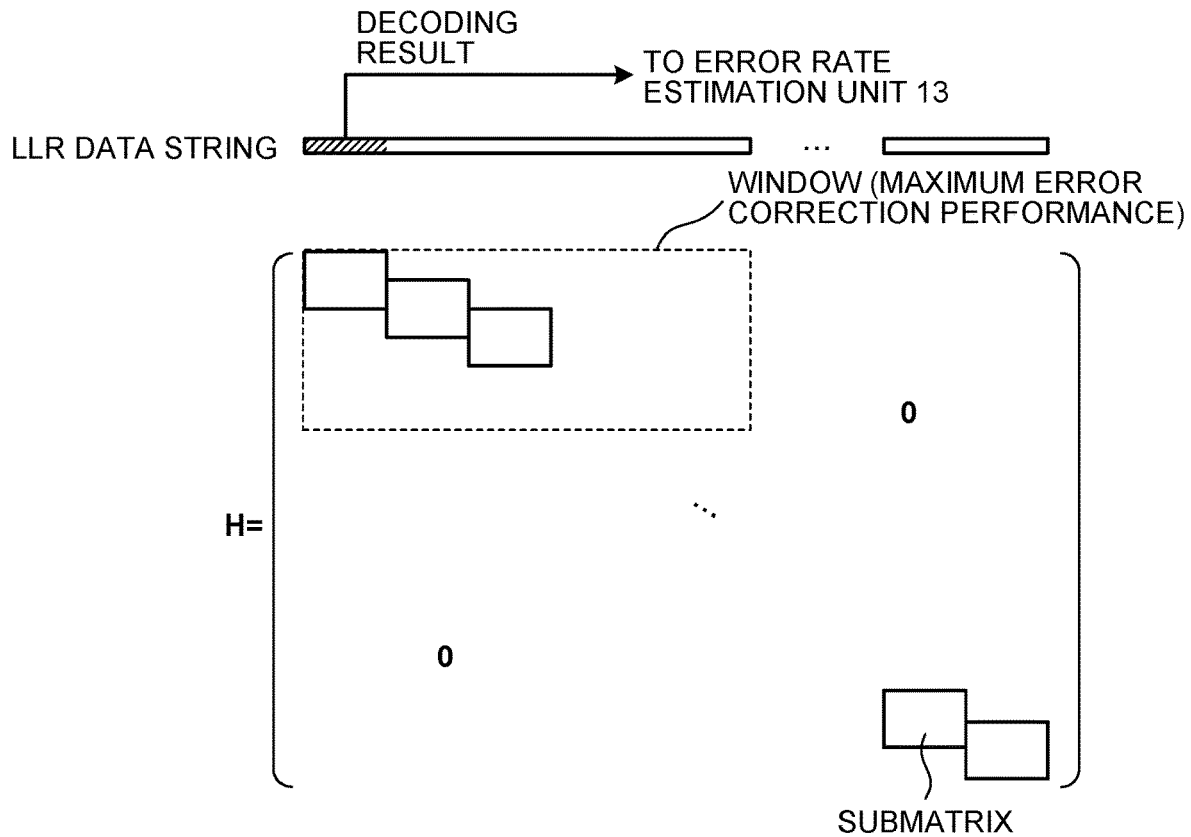
FIG. 7 is a diagram for explaining an initial step of error correction decoding processing performed by a decoder according to the first embodiment.

FIG. 7 is a diagram for explaining an initial step of the error correction decoding processing performed by the decoder 1 according to the first embodiment. In the decoder 1 according to the present embodiment, the error-correction decoder 12 sets values that allow maximum error correction performance among decoding parameters (the window size, the number of decoding iterations) that can satisfy a target throughput, for the head of a spatially coupled LDPC code input, specifically, the head of an LLR data string input from the likelihood generation unit 11, and performs decoding processing in the initial step. A decoding result obtained in this initial step is output as a decoding result and is also sent to the error rate estimation unit 13.

The error rate estimation unit 13 estimates the error rate of the received signal using the decoding result in the initial step input from the error-correction decoder 12. The error rate of the received signal can be obtained, for example, from the result of detection of error-corrected bits that are detected by comparing the result of hard decision on the LLR data before error correction with the hard-decision result of the decoding result in the initial step. Specifically, the error rate estimation unit 13 assumes that the number of error-corrected bits (hereinafter, referred to as the number of corrected bits) is the number of bits in which errors have occurred, and divides the number of corrected bits by the number of decoded bits, thereby estimating the error rate of the received signal. The estimated error rate is sent to the decoding parameter control unit 14. The output result of the decoding processing is a fixed value in units of the number of columns of the submatrix. Thus, the error rate estimation unit 13 may output the number of error bits instead of the error rate to the decoding parameter control unit 14.

The decoding parameter control unit 14 determines the window size and the number of decoding iterations, which are decoding parameters, on the basis of the error rate of the received signal input from the error rate estimation unit 13. As described above, by the control of the decoding parameters, the error correction performance is changed, leading to the control of power at the same time. Therefore, the decoding parameter control unit 14 determines decoding parameters that allow necessary and sufficient error correction performance on the basis of the error rate of the received signal. In the determination of decoding parameters, for example, a list of decoding parameters that allow sufficient error correction performance for received signal error rates is held. When the error rate of the received signal is input, the decoding parameter control unit 14 selects decoding parameters associated with the input error rate from the list and sets the decoding parameters as decoding parameters to be used. This facilitates the determination of decoding parameters. The decoding parameter control unit 14 notifies the error-correction decoder 12 of the determined decoding parameters.

Figure 8:
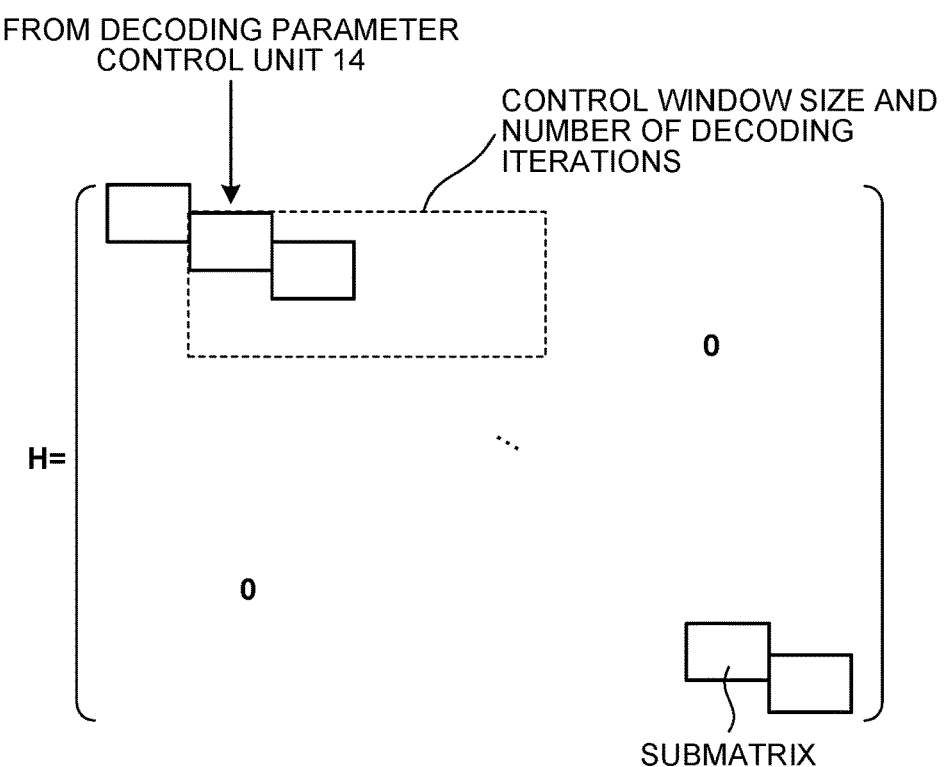
FIG. 8 is a diagram for explaining a second step of the error correction decoding processing performed by the decoder according to the first embodiment.

FIG. 8 illustrates processing in a step next to the initial step illustrated in FIG. 7. FIG. 8 is a diagram for explaining a second step of the error correction decoding processing performed by the decoder 1 according to the first embodiment.

As illustrated in FIG. 8, in the second step that is a step next to the initial step, the error-correction decoder 12 of the decoder 1 receives a notification of the decoding parameters determined by the decoding parameter control unit 14, changes the settings of the window size and the number of decoding iterations to the window size and the number of decoding iterations indicated by the decoding parameters, and performs decoding processing. If the decoding parameters in the notification from the decoding parameter control unit 14 are the same as the decoding parameters used in the initial step, the error-correction decoder 12 performs the decoding processing without changing the settings of the window size and the number of decoding iterations. In decoding processing in steps subsequent to the second step, the error-correction decoder 12 uses the same decoding parameters as those in the second step.

Figure 9:
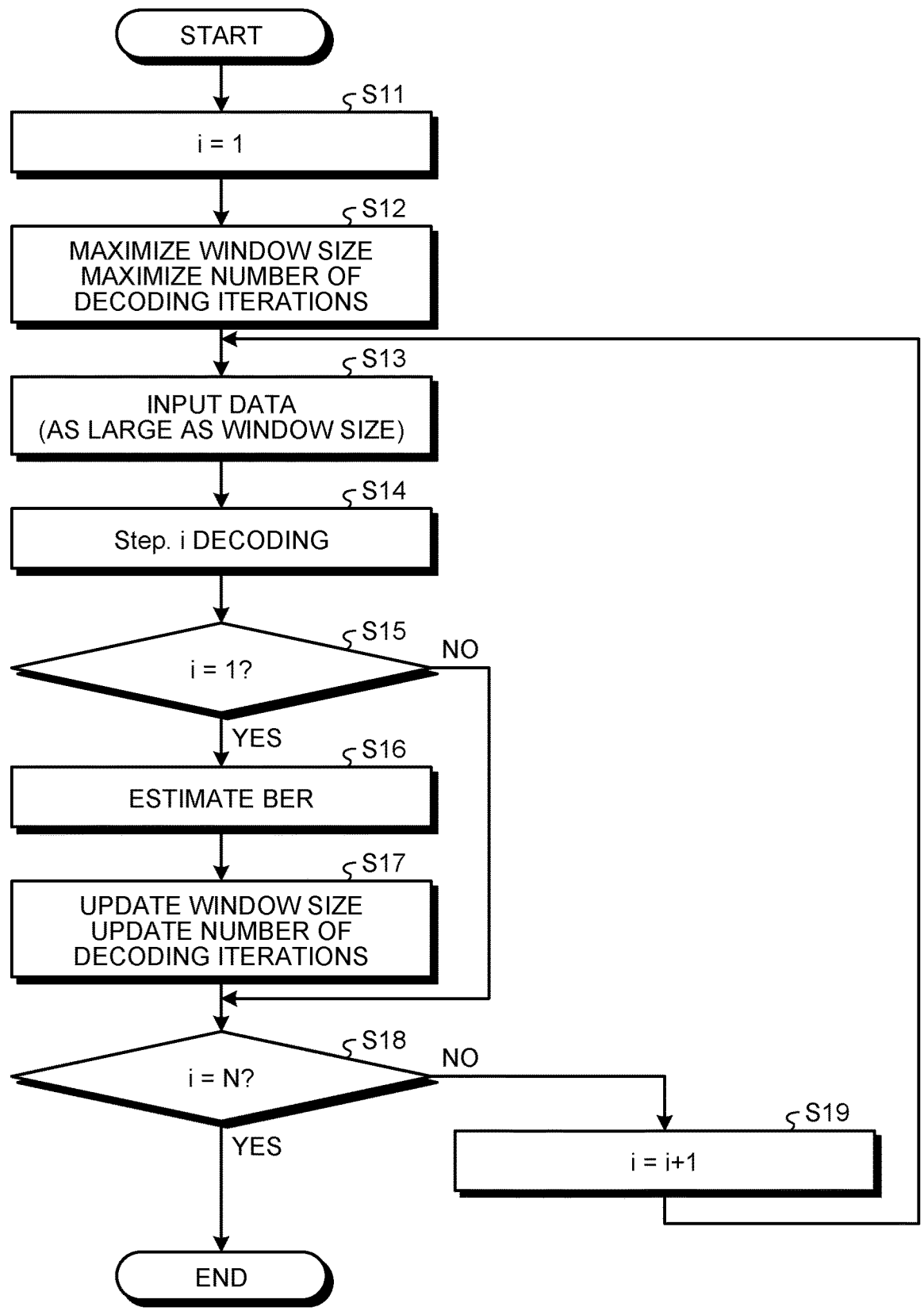
FIG. 9 is a flowchart illustrating an example of the error correction decoding processing performed by the decoder according to the first embodiment.

The above error correction decoding processing performed by the decoder 1 according to the first embodiment is shown in a flowchart in FIG. 9. FIG. 9 is a flowchart illustrating an example of the error correction decoding processing performed by the decoder according to the first embodiment.

As illustrated in FIG. 9, in the error correction decoding processing performed by the decoder 1, first, the error-correction decoder 12 sets a variable i indicating the step number of the decoding processing to "i=1" (step S11). Next, the error-correction decoder 12 sets the decoding parameters to initial values. Specifically, the error-correction decoder 12 sets the respective values of the window size and the number of decoding iterations to the maxima (step S12). Next, the error-correction decoder 12 inputs data as large as the window size to the window decoder 21 (step S13). That is, data as large as the window size is input from the data storage unit 22 to the window decoder 21. Next, the error-correction decoder 12 performs Step. i decoding (decoding processing in the ith step) (step S14).

Next, the error-correction decoder 12 determines whether "i=1" holds (step S15). If "i=1" holds (step S15: Yes), the error rate estimation unit 13 estimates the bit error rate (BER) indicating the error rate of the received signal (step S16). That is, if "i=1", the error-correction decoder 12 outputs a decoding result in step S14 to the error rate estimation unit 13, and the error rate estimation unit 13 estimates the BER on the basis of the input decoding result.

When the error rate estimation unit 13 obtains the estimated value of the BER by executing step S16, next, the decoding parameter control unit 14 determines decoding parameters on the basis of the estimated value of the BER, and the error-correction decoder 12 updates the window size and the number of decoding iterations according to the results of the determination (step S17). Depending on the estimated value of the BER obtained in step S16, only one of the window size and the number of decoding iterations may be updated in step S17, or neither the window size nor the number of decoding iterations may be updated.

If it is determined in step S15 described above that "i=1" does not hold (step S15: No), or if the decoding parameters are updated by executing step S17, the error-correction decoder 12 determines whether "i=N" holds (step S18). The value of N is set on the basis of the configuration of the parity check matrix H illustrated in FIG. 3 and the size of the window. Specifically, the number of shifts performed until the position of the window reaches the lower right end of the parity check matrix H illustrated in FIG. 3 is set as the value of N. The number of shifts can be obtained from the size of the window and the size of the parity check matrix H when the size of the window is determined.

If "i=N" holds (step S18: Yes), the error correction decoding processing performed by the error-correction decoder 12 of the decoder 1 is finished. On the other hand, if "i=N" does not hold (step S18: No), the error-correction decoder 12 increments i (step S19), returns to step S13, and repeats the processing in steps S13 to S18. Although not illustrated in FIG. 9, after incrementing i in step S19, the error-correction decoder 12 shifts the window in the lower right direction by one submatrix as described with reference to FIGS. 4 and 5.

As described above, in the window decoding of performing iterative decoding while changing the window position, the decoder 1 according to the present embodiment uses decoding parameters that maximize the error correction performance until a first decoding result is obtained by executing the initial step. When the first decoding result is obtained, the decoder 1 determines decoding parameters to be used in subsequent decoding processing on the basis of the decoding result. This allows error correction decoding on a received signal with a necessary and sufficient amount of processing, and thus allows a reduction in the power of the decoder 1. Further, since sufficiently strong decoding parameters are used in decoding in the initial step, and based on the result, decoding parameters in subsequent steps are uniquely determined, the repetition of adjustment of decoding parameters, which occurs in the method described in Japanese Patent Application Laid-open No. 2013-198017, can be prevented from occurring, and processing delay can be prevented from increasing.

In the present embodiment, as a basic configuration, only a decoding result in the initial step is used to estimate the error rate of a received signal, but decoding results in a plurality of steps may be used to estimate the error rate. Using a plurality of steps increases the possibility that the error correction decoding processing is performed with excessive error correction performance for received signal quality. That is, there is a high possibility that decoding parameters that cause excessive error correction performance are used in the plurality of steps until the estimation of the error rate of the received signal is completed. However, the number of samples for error rate estimation increases, so that the accuracy of decoding parameter determination can be improved by the improved reliability of an estimation result.

In the present embodiment, an error rate estimated in the initial step and decoding parameters determined on the basis of the error rate are applied from decoding processing in the next step, but, for example, may be applied from the middle of the next step or may be applied from decoding processing after the next step. This increases the possibility that decoding processing is performed with excessive error correction performance for received signal quality. However, decoding processing in the next step and a process related to the determination of decoding parameters can be provided in parallel, leading to an increase in processing speed and an improvement in circuit implementability. These modified configurations, that is, configurations obtained by partially modifying the basic configuration may be used in combination by taking into account variations in signal quality and the implementability of the decoder 1.

In the decoder 1 according to the present embodiment, the error rate estimation unit 13 estimates the bit error rate of a received signal on the basis of one or more decoding results obtained by decoding processing iteratively executed by the error-correction decoder 12, and the decoding parameter control unit 14 determines decoding parameters on the basis of the bit error rate estimation result. However, the bit error rate of a received signal is an example of information indicating the quality of the received signal. The determination of decoding parameters using the bit error rate is not a limitation. Decoding parameters may be determined using other information indicating the quality of a received signal instead of the bit error rate. That is, the error rate estimation unit 13 is an example of a signal quality estimation unit that estimates the quality of a received signal on the basis of one or more decoding results obtained by decoding processing iteratively executed by the error-correction decoder 12.

Second Embodiment

In the first embodiment above, to determine decoding parameters for a spatially coupled LDPC code, an error rate is estimated using the result of decoding in an initial step of a code sequence received. However, since the decoding parameters based on the result of decoding in the initial step are applied to the entire code sequence, it is required that the transmission line be relatively static, and performance variation be small from the start to the end of the code. Therefore, the present embodiment describes a decoder applied in a case where transmission line characteristics vary with time, and performance varies between the start and the end of the code.

The configuration of the decoder according to the present embodiment is that illustrated in FIGS. 1 and 2 like the decoder according to the first embodiment. As in the first embodiment, window decoding is applied to a decoding scheme. In the present embodiment described below, differences from the first embodiment will be described. For explanatory convenience, the decoder according to the present embodiment is referred to as a decoder 1a.

In an initial step of window decoding performed by the decoder 1a according to the second embodiment, the same processing as in the initial step of the window decoding performed by the decoder 1 according to the first embodiment is performed. That is, in the initial step of the window decoding, as illustrated in FIG. 7, the decoder 1a sets values that allow maximum error correction performance among decoding parameters (the window size, the number of decoding iterations) that can satisfy a target throughput, and performs decoding processing on the head of an LLR data string.

Figure 10:
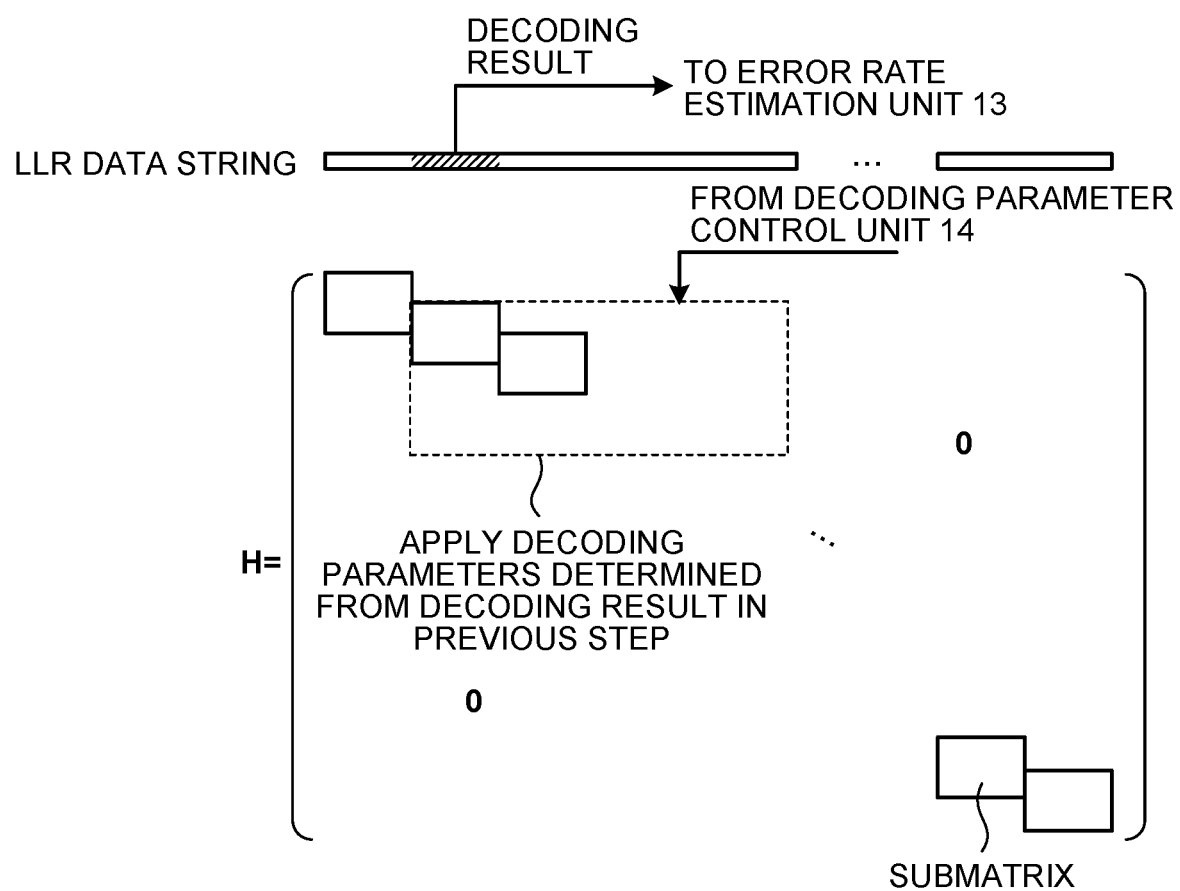
FIG. 10 is a diagram for explaining a second step of error correction decoding processing performed by a decoder according to a second embodiment.

In a step next to the initial step, the decoder 1a performs processing illustrated in FIG. 10. FIG. 10 is a diagram for explaining a second step of error correction decoding processing performed by the decoder 1a according to the second embodiment. As illustrated in FIG. 10, the error-correction decoder 12 of the decoder 1a performs decoding processing using the decoding parameters determined on the basis of the decoding result in the initial step as in the first embodiment. On the other hand, in the present embodiment, by outputting a decoding result in a current step to the error rate estimation unit 13, the update of the decoding parameters in the next step is further performed. That is, the decoder 1a sequentially updates the decoding parameters on the basis of a decoding result obtained in each step of the error correction decoding processing. This allows the following of optimum decoding parameters for decoding processing even if reception quality changes during the middle of a spatially coupled LDPC code due to the time variation of the transmission line, allowing a more stable reduction in the power of the decoder 1a.

In the present embodiment, as a basic configuration, only a decoding result in one step is used to estimate the error rate of a received signal, but decoding results in a plurality of steps may be used to estimate the error rate as in the first embodiment. Further, decoding parameters in a current step are determined on the basis of an error rate estimated in the previous step, but may be determined on the basis of an error rate estimated in a step before the previous step.

In the present embodiment, the error rate of a received signal is estimated using only a decoding result in the previous step when decoding parameters are determined. Alternatively, decoding results in a plurality of steps including a step(s) before the previous step may be used. By utilizing decoding results in a plurality of steps, for example, a weighted average can be taken to improve the accuracy of estimation of current communication quality. Further, the application of the Kalman filter or the like allows the estimation of an error rate in a next step. For these modified configurations, some modified configurations may be used in combination by taking into account variations in signal quality and the implementability of the decoder 1a.

In the above description, error rate estimation and decoding parameter update are performed in all decoding processing steps, but may be intermittently performed.

Third Embodiment

In the first and second embodiments above, the decoding parameters are optimized within one spatially coupled LDPC code received. Thus, when a new spatially coupled LDPC code sequence is input, the decoding parameters are initialized to values that allow maximum error correction performance, to advance the error correction decoding processing. However, it is unlikely that reception quality significantly varies in a temporally continuous received signal. Therefore, a decoder according to the present embodiment obtains an estimated value of the bit error rate using the result of decoding of a certain spatially coupled LDPC code, and determines, based on the estimated value, the initial values of the decoding parameters for the error correction decoding of a next spatially coupled LDPC code.

The configuration of the decoder according to the present embodiment is that illustrated in FIGS. 1 and 2 like the decoders according to the first and second embodiments. Further, as in the first and second embodiments, window decoding is applied to a decoding scheme. In the present embodiment described below, differences from the first and second embodiments will be described. For explanatory convenience, the decoder according to the present embodiment is referred to as a decoder 1b.

Figure 11:
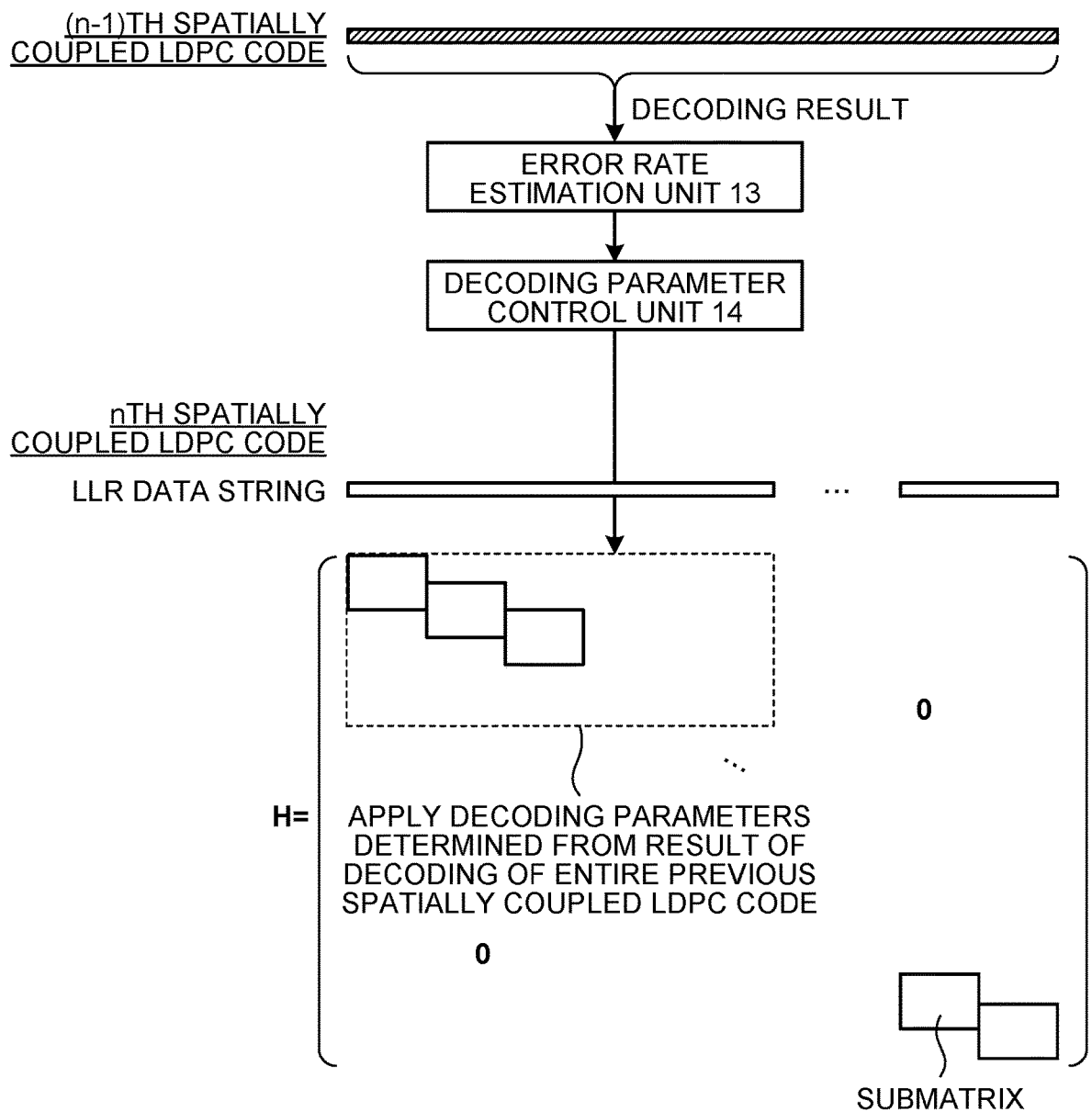
FIG. 11 is a diagram for explaining error correction decoding processing performed by a decoder according to a third embodiment.

FIG. 11 is a diagram for explaining error correction decoding processing performed by the decoder 1b according to a third embodiment. For the sake of explanation, a code currently subjected to the error correction decoding processing is referred to as an nth spatially coupled LDPC code. In a case where the error correction decoding processing is serially performed, when the nth spatially coupled LDPC code is decoded, the decoding of the (n−1)th spatially coupled LDPC code has been completed. The decoder 1b according to the present embodiment estimates the error rate of a received signal on the basis of the result of decoding of the (n−1)th spatially coupled LDPC code, and determines decoding parameters on the basis of the estimated error rate. That is, as illustrated in FIG. 11, the result of decoding of the (n−1)th spatially coupled LDPC code is input to the error rate estimation unit 13, and the error rate estimation unit 13 estimates the error rate of the received signal. Next, the decoding parameter control unit 14 determines decoding parameters on the basis of an estimated value of the error rate obtained by the error rate estimation unit 13. Then, using the decoding parameters determined by the decoding parameter control unit 14, the error-correction decoder 12 of the decoder 1b starts the error correction decoding processing on the nth spatially coupled LDPC code. That is, the decoder 1b applies the decoding parameters determined using the result of decoding of the (n−1)th spatially coupled LDPC code to the initial step of the error correction decoding processing on the nth spatially coupled LDPC code. Like the decoder 1 according to the first embodiment, upon obtaining a decoding result in the initial step, the decoder 1b determines decoding parameters to be applied to decoding processing in the next and subsequent steps on the basis of the obtained decoding result. In the error correction decoding processing on the following (n+1)th spatially coupled LDPC code, the decoder 1b applies decoding parameters determined using the result of decoding of the nth spatially coupled LDPC code to decoding processing in the initial step. Thereafter, the decoder 1b likewise determines initial values of the decoding parameters to be used in the error correction decoding processing on a spatially coupled LDPC code, that is, decoding parameters to be applied to decoding processing in the initial step, using the result of decoding of the previous spatially coupled LDPC code.

This allows decoding with parameters suitable for received signal quality from the initial step of the error correction decoding processing, allowing an efficient reduction in power. When starting the decoding of a spatially coupled LDPC code string, that is, when there is no spatially coupled LDPC code corresponding to the (n−1)th spatially coupled LDPC code, the decoder 1b starts the error correction decoding processing using decoding parameters that maximize error correction performance as in the first and second embodiments.

The present embodiment has been described on the assumption that the error correction decoding processing on the (n−1)th spatially coupled LDPC code and the error correction decoding processing on the nth spatially coupled LDPC code are sequentially performed. However, in actuality, there may be a case where in a decoder that achieves a desired throughput, the window decoder 21 and the data storage unit 22 are parallelized, and the nth and (n−1)th spatially coupled LDPC codes are decoded at the same timing. Thus, decoding parameters determined on the basis of the result of decoding of the (n−1)th spatially coupled LDPC code may be applied from the error correction decoding processing on the (n+i)th (i≥0) or a subsequent spatially coupled LDPC code.

Fourth Embodiment

In the third embodiment, initial values of the decoding parameters to be applied to the error correction decoding processing on a current spatially coupled LDPC code are determined by utilizing the result of decoding of the previous spatially coupled LDPC code. To implement the configuration described in the third embodiment, the error rate estimation unit 13 that estimates the error rate of a received signal necessary to determine decoding parameters in the decoder 1b requires the addition of a function to calculate the error rate of the entire spatially coupled LDPC code to the error rate estimation unit 13 applied to the first and second embodiments. Therefore, the present embodiment describes the form of a decoder that does not require the addition of a function to calculate the error rate of the entire spatially coupled LDPC code.

The configuration of the decoder according to the present embodiment is that illustrated in FIGS. 1 and 2 like the decoders according to the first to third embodiments. As in the first to third embodiments, window decoding is applied to a decoding scheme. For explanatory convenience, the decoder according to the present embodiment is referred to as a decoder 1c.

Figure 12:
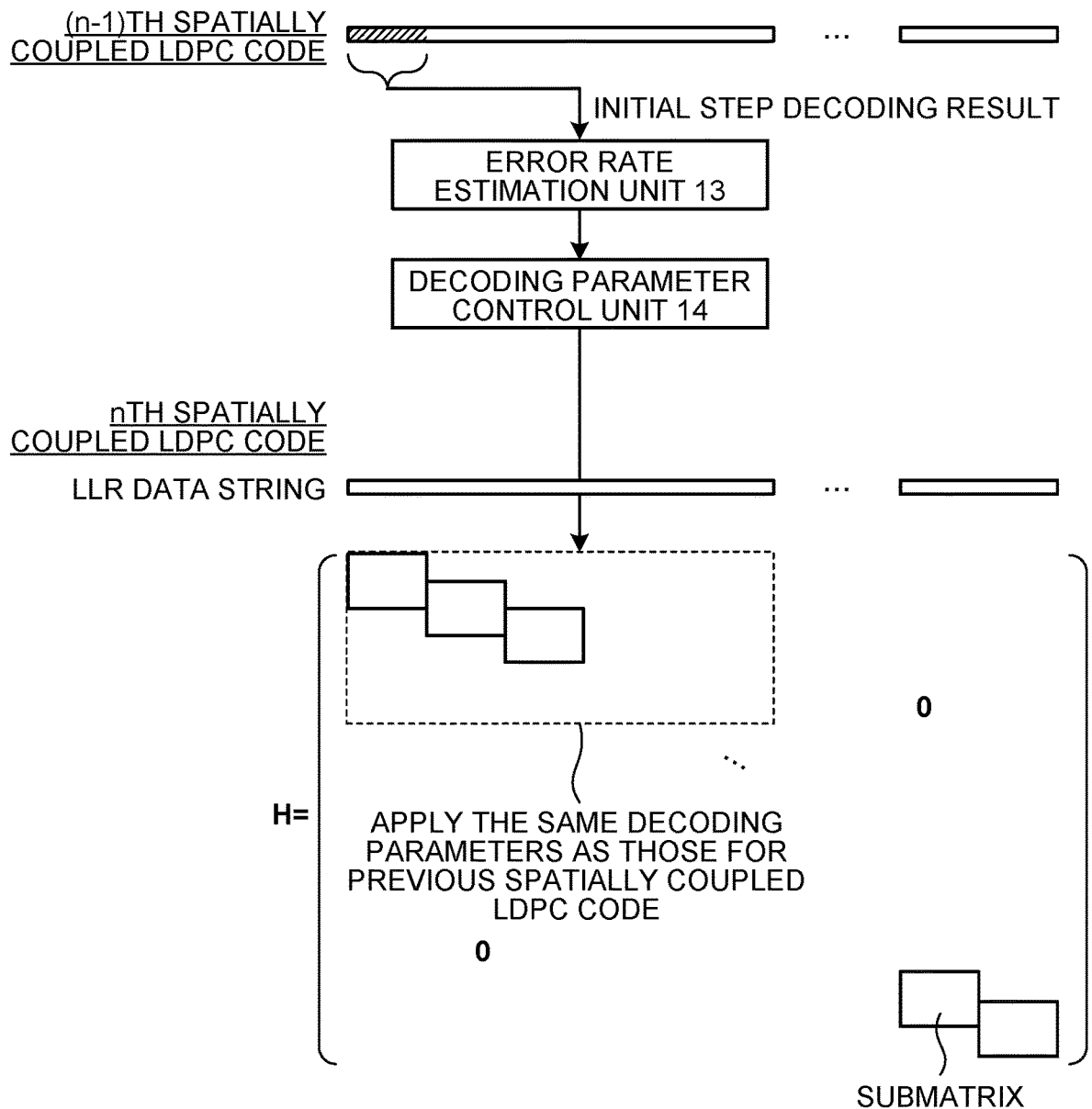
FIG. 12 is a diagram for explaining error correction decoding processing performed by a decoder according to a fourth embodiment.

FIG. 12 is a diagram for explaining error correction decoding processing performed by the decoder 1c according to a fourth embodiment. FIG. 12 illustrates a case where the decoder 1c determines decoding parameters by utilizing the result of decoding of the previous spatially coupled LDPC code while performing a similar error correction decoding processing to the error correction decoding processing described in the first embodiment.

As described above, the decoder 1 according to the first embodiment determines decoding parameters on the basis of the result of decoding in the initial step, and applies the same parameters to all decoding processing steps after the initial step on a spatially coupled LDPC code received. As illustrated in FIG. 12, in the decoder 1c that decodes a spatially coupled LDPC code by a similar procedure to that in the first embodiment, the error rate estimation unit 13 estimates a bit error rate on the basis of the result of decoding obtained in the initial step of the error correction decoding processing on the (n−1)th spatially coupled LDPC code, and the decoding parameter control unit 14 determines decoding parameters on the basis of an estimated value of the bit error rate. Then, the decoding parameters are applied to the initial step of the error correction decoding processing on the nth spatially coupled LDPC code.

Thus, when decoding a spatially coupled LDPC code by a similar procedure to that in the first embodiment, the decoder 1c applies decoding parameters determined on the basis of a decoding result obtained in the initial step of the error correction decoding processing on the (n−1)th spatially coupled LDPC code, not only to the error correction decoding processing on the (n−1)th spatially coupled LDPC code but also to the initial step of the error correction decoding processing on the nth spatially coupled LDPC code. The decoder 1c applies decoding parameters determined on the basis of a decoding result in the initial step to each step after the initial step on the nth spatially coupled LDPC code. The decoder 1c also determines decoding parameters to be used in the error correction decoding processing on the (n+1)th and subsequent spatially coupled LDPC codes in a similar manner.

Figure 13:
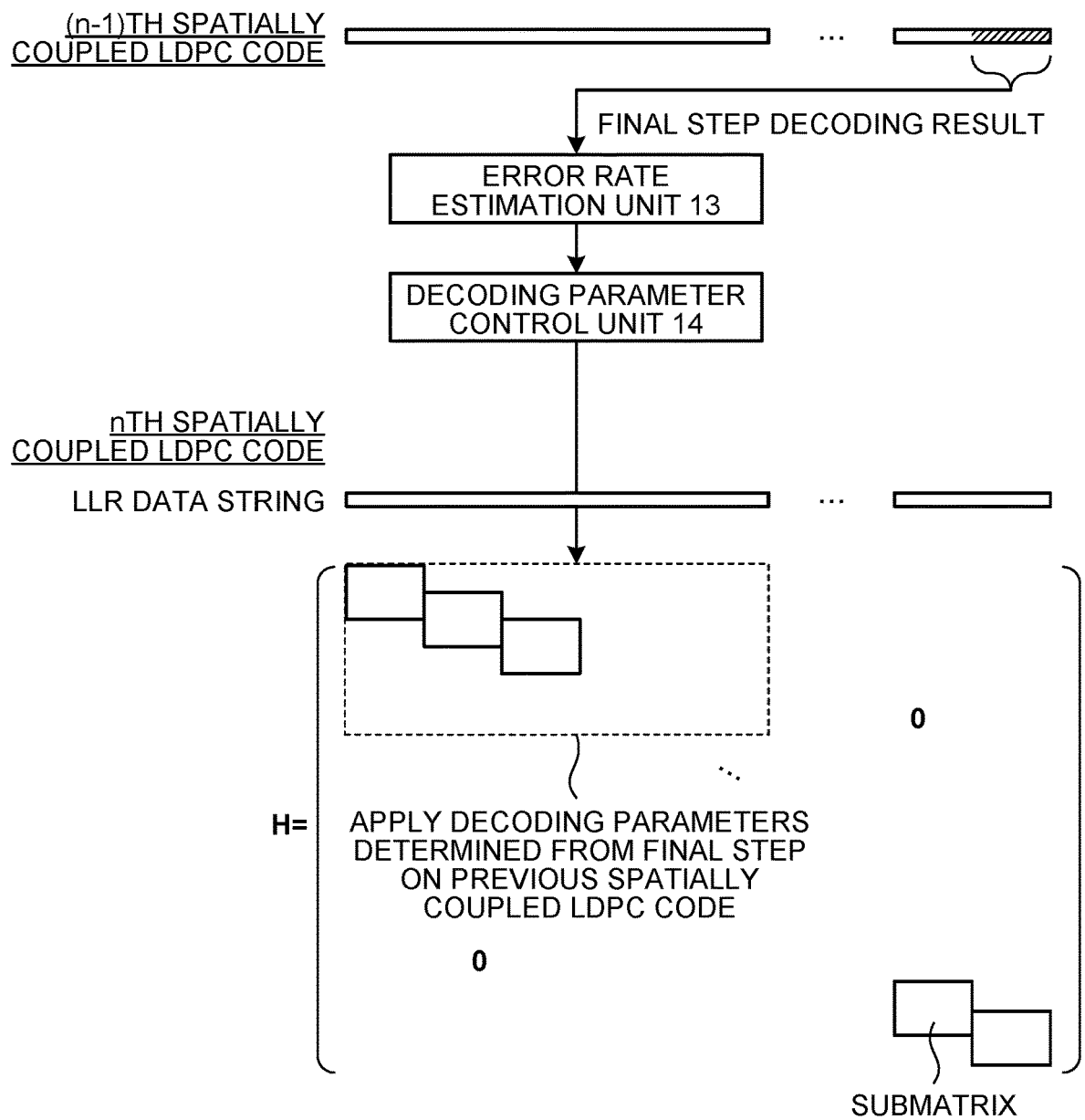
FIG. 13 is a diagram for explaining another error correction decoding processing performed by the decoder according to the fourth embodiment.

FIG. 13 is a diagram for explaining another error correction decoding processing performed by the decoder 1c according to the fourth embodiment. FIG. 13 illustrates a case where the decoder 1c determines decoding parameters by utilizing the result of decoding of the previous spatially coupled LDPC code while performing a similar error correction decoding processing to the error correction decoding processing described in the second embodiment.

As described above, the decoder 1a according to the second embodiment determines, on the basis of a decoding result obtained in each step of the error correction decoding processing on a spatially coupled LDPC code, decoding parameters to be used in a subsequent step. That is, the decoder 1a updates the decoding parameters on the basis of a decoding result in each step of the error correction decoding processing on a spatially coupled LDPC code. As illustrated in FIG. 13, in the decoder 1c that decodes a spatially coupled LDPC code by a similar procedure to that in the second embodiment, the error rate estimation unit 13 estimates a bit error rate on the basis of a decoding result in a final step of the error correction decoding processing on the (n−1)th spatially coupled LDPC code, and the decoding parameter control unit 14 determines decoding parameters on the basis of an estimated value of the bit error rate. Then, the decoding parameters are applied to the initial step of the error correction decoding processing on the nth spatially coupled LDPC code.

Thus, when decoding a spatially coupled LDPC code by a similar procedure to that in the second embodiment, the decoder 1c estimates the bit error rate and updates the decoding parameters on the basis of a decoding result in the final step of the error correction decoding processing on the (n−1)th spatially coupled LDPC code, and applies the updated decoding parameters to the initial step of the error correction decoding processing on the nth spatially coupled LDPC code. The decoder 1c also determines decoding parameters to be used in the error correction decoding processing on the (n+1)th and subsequent spatially coupled LDPC codes in a similar manner.

The above configuration allows decoding with decoding parameters suitable for received signal quality from the initial step of the error correction decoding processing on each spatially coupled LDPC code without adding a function to calculate the error rate of the entire spatially coupled LDPC code to the first and second embodiments. As a result, an efficient reduction in power can be achieved.

The error correction decoding processing described in the present embodiment is described on the basis of the basic configurations of the first and second embodiments, but may be implemented on the basis of the modified configurations described in each embodiment.

Further, as in the third embodiment, by taking into account constraints such as throughput and implementation conditions, etc., decoding parameters determined on the basis of the (n−1)th decoding result may be applied from the error correction decoding processing on the (n+i)th (i≥0) or a subsequent spatially coupled LDPC code. Furthermore, a limit may be set on the number of repetitions of processing to determine initial values of the decoding parameters by utilizing the result of decoding of the previous spatially coupled LDPC code as above. That is, each time the number of repetitions of this processing reaches a predetermined number, the decoding parameters may be returned to settings that allow maximum error correction performance, and the processing may be started again. Instead of setting a limit on the number of repetitions of the processing, a limit may be set on the time of repeating the processing, and each time a predetermined time has elapsed, the decoding parameters may be returned to settings that allow maximum error correction performance.

Next, a hardware configuration of the decoder described in the first to fourth embodiments will be described. The decoder described in the first to fourth embodiments can be implemented by dedicated processing circuitry. The dedicated processing circuitry is, for example, a single circuit, a combined circuit, a programmed processor, a parallel-programmed processor, an application-specific integrated circuit (ASIC), a field-programmable gate array (FPGA), or a circuit that combines them.

Figure 14:
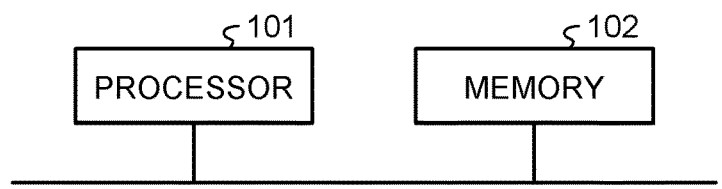
FIG. 14 is a diagram illustrating an example of hardware that implements the decoder according to the first to fourth embodiments.

Alternatively, the decoder described in the first to fourth embodiments may be implemented by a control circuit including a processor 101 and a memory 102 illustrated in FIG. 14. FIG. 14 is a diagram illustrating an example of hardware that implements the decoder according to the first to fourth embodiments. The processor 101 is a central processing unit (CPU, also called a central processor, a processing unit, an arithmetic unit, a microprocessor, a microcomputer, a processor, or a digital signal processor (DSP)). The memory 102 is, for example, a nonvolatile or volatile semiconductor memory such as a random-access memory (RAM), a read-only memory (ROM), a flash memory, an erasable programmable read-only memory (EPROM), or an electrically erasable programmable read-only memory (EEPROM).

When the decoder described in the first to fourth embodiments is implemented by the control circuit illustrated in FIG. 14, a program for operating as the likelihood generation unit 11, the error-correction decoder 12, the error rate estimation unit 13, and the decoding parameter control unit 14 of the decoder is stored in the memory 102 in advance. The processor 101 reads and executes the program stored in the memory 102 to operate as the likelihood generation unit 11, the error-correction decoder 12, the error rate estimation unit 13, and the decoding parameter control unit 14 of the decoder. The data storage unit 22 constituting the error-correction decoder 12 is implemented by the memory 102.

Part of the likelihood generation unit 11, the error-correction decoder 12, the error rate estimation unit 13, and the decoding parameter control unit 14 may be implemented by dedicated processing circuitry, and the rest may be implemented by the processor 101 and the memory 102 illustrated in FIG. 14.

The decoding apparatus according to the disclosure has the effect of being able to reduce processing delay and power consumption when decoding a spatially coupled low-density parity-check code.

The configurations illustrated in the above embodiments illustrate an example, and can be combined with another known art, and can be partly omitted or changed without departing from the scope.

What is claimed is:

1. A decoding apparatus comprising:
an error-correction decoder to execute error correction decoding processing of iteratively performing decoding processing with a window size and the number of decoding iterations indicated by decoding parameters, on received data converted into a spatially coupled low-density parity-check code; and
a decoding parameter controller to update the decoding parameters on a basis of a decoding result obtained by the iteratively executed decoding processing, wherein
the decoding parameter controller determines initial values of the decoding parameters that are applied to the decoding processing performed on current received data that is decoded, on a basis of a decoding result obtained by the decoding processing executed first among the decoding processing iteratively executed on received data that is decoded before the current received data is decoded, and
the decoding parameter controller sets the decoding parameters that are applied to the first decoding processing after the error-correction decoder starts the error correction decoding processing, to values of the window size and the number of decoding iterations that maximize error correction performance among settable values.

2. The decoding apparatus according to claim 1, further comprising:
a signal quality estimator to estimate quality of a received signal on a basis of one or more decoding results obtained by the iteratively executed decoding processing, wherein
the decoding parameter controller updates the decoding parameters on a basis of the quality estimated by the signal quality estimator.

3. The decoding apparatus according to claim 2, wherein the decoding parameter controller determines, on a basis of a decoding result obtained by the first decoding processing after the error-correction decoder starts the error correction decoding processing, decoding parameters to be that are applied to the subsequent decoding processing.

4. The decoding apparatus according to claim 2, wherein each time a decoding result is obtained by the iteratively executed decoding processing, the decoding parameter controller determines, on a basis of the obtained decoding result, decoding parameters that are applied to the subsequent decoding processing.

5. The decoding apparatus according to claim 1, wherein the decoding parameter controller determines, on a basis of a decoding result obtained by the first decoding processing after the error-correction decoder starts the error correction decoding processing, decoding parameters that are applied to the subsequent decoding processing.

6. The decoding apparatus according to claim 1, wherein each time a decoding result is obtained by the iteratively executed decoding processing, the decoding parameter controller determines, on a basis of the obtained decoding result, decoding parameters that are applied to the subsequent decoding processing.

7. A control circuit to control a decoding apparatus, the control circuit causing the decoding apparatus to execute:

executing error correction decoding processing of iteratively performing decoding processing with a window size and the number of decoding iterations indicated by decoding parameters, on received data converted into a spatially coupled low-density parity-check code, and updating the decoding parameters on a basis of a decoding result obtained by the iteratively executed decoding processing, wherein the updating includes determining initial values of the decoding parameters that are applied to the decoding processing to be performed on current received data that is decoded, on a basis of a decoding result obtained by the decoding processing executed first among the decoding processing iteratively executed on received data that is decoded before the current received data is decoded, and the updating includes setting the decoding parameters that are applied to the first decoding processing after the error-correction decoder starts the error correction decoding processing, to values of the window size and the number of decoding iterations that maximize error correction performance among settable values.

8. A non-transitory storage medium storing a program to control a decoding apparatus, the program causing the decoding apparatus to execute:

executing error correction decoding processing of iteratively performing decoding processing with a window size and the number of decoding iterations indicated by decoding parameters, on received data converted into a spatially coupled low-density parity-check code, and updating the decoding parameters on a basis of a decoding result obtained by the iteratively executed decoding processing, wherein the updating includes determining initial values of the decoding parameters that are applied to the decoding processing performed on current received data that is decoded, on a basis of a decoding result obtained by the decoding processing executed first among the decoding processing iteratively executed on received data that is decoded before the current received data is decoded, and the updating includes setting the decoding parameters that are applied to the first decoding processing after the error-correction decoder starts the error correction decoding processing, to values of the window size and the number of decoding iterations that maximize error correction performance among settable values.

* * * * *